United States Patent
Longhurst et al.

(10) Patent No.: US 11,917,796 B2
(45) Date of Patent: Feb. 27, 2024

(54) HEAT SINK FOR LIQUID COOLING

(71) Applicant: ICEOTOPE GROUP LIMITED, Rotherham (GB)

(72) Inventors: Nathan Longhurst, Rotherham (GB); Jason Matteson, Raleigh, NC (US); David Amos, Sheffield (GB)

(73) Assignee: Iceotope Group Limited, Rotherham (GB)

( * ) Notice: Subject to any disclaimer, the term of this patent is extended or adjusted under 35 U.S.C. 154(b) by 0 days.

(21) Appl. No.: 17/777,242

(22) PCT Filed: Nov. 18, 2020

(86) PCT No.: PCT/GB2020/052931
§ 371 (c)(1),
(2) Date: May 16, 2022

(87) PCT Pub. No.: WO2021/099770
PCT Pub. Date: May 27, 2021

(65) Prior Publication Data
US 2022/0408609 A1    Dec. 22, 2022

(30) Foreign Application Priority Data

Nov. 18, 2019  (GB) ...................... 1916771

(51) Int. Cl.
*H05K 7/20*    (2006.01)
*H01L 23/473*  (2006.01)
*H05K 1/02*    (2006.01)

(52) U.S. Cl.
CPC ..... *H05K 7/20772* (2013.01); *H05K 7/20236* (2013.01); *H01L 23/473* (2013.01);
(Continued)

(58) Field of Classification Search
CPC .......... H05K 7/20236; H05K 7/20254; H05K 7/20772; H05K 1/0203; H05K 2201/066; H01L 23/473; H01L 23/4735
See application file for complete search history.

(56) References Cited

U.S. PATENT DOCUMENTS 6,973,801 B1   12/2005   Campbell
7,911,793 B2 *  3/2011   Attlesey .............. H01L 23/473
                                             174/15.1
(Continued)

FOREIGN PATENT DOCUMENTS

JP    H0361349 U    6/1991
JP    H1027978 A    1/1998
(Continued)

OTHER PUBLICATIONS

International Search Report and Written Opinion issued in App. No. PCT/GB2020/052931, dated Feb. 3, 2021, 14 pages.
(Continued)

*Primary Examiner* — Zachary Pape
(74) *Attorney, Agent, or Firm* — Butzel Long

(57) ABSTRACT

A module is provided for housing electronic devices and a liquid coolant. The module comprises: a housing defining a sealable internal volume for containing the electronic devices and the liquid coolant, the sealable internal volume having a base; a substrate in the sealable internal volume approximately parallel to the base, one of the electronic devices being mounted on a side of the substrate proximal the base; and a heat sink device, comprising a receptacle part defining an internal volume that is arranged to receive the liquid coolant and accumulate the liquid coolant therein. The heat sink is mounted such that the one of the electronic devices or a component that is thermally conductively (Continued)

coupled to the one of the electronic devices is at least partially within the internal volume.

16 Claims, 10 Drawing Sheets

(52) U.S. Cl.
CPC ........ *H01L 23/4735* (2013.01); *H05K 1/0203* (2013.01); *H05K 7/20254* (2013.01); *H05K 2201/066* (2013.01)

(56) References Cited

U.S. PATENT DOCUMENTS

| | | | | |
|---|---|---|---|---|
| 8,944,151 | B2* | 2/2015 | Flotta | H05K 7/20772 165/80.4 |
| 9,717,161 | B2* | 7/2017 | Katsumata | H05K 7/20254 |
| 2010/0103620 | A1* | 4/2010 | Campbell | H05K 7/20772 361/702 |
| 2014/0078672 | A1 | 3/2014 | Brunschwiler | |
| 2014/0198452 | A1 | 7/2014 | Brunschwiler | |
| 2016/0143185 | A1 | 5/2016 | Campbell | |
| 2018/0343774 | A1* | 11/2018 | Smith | G06F 1/206 |
| 2019/0090383 | A1* | 3/2019 | Tufty | H05K 7/20263 |
| 2019/0297747 | A1* | 9/2019 | Wakino | H01L 23/427 |
| 2021/0195805 | A1* | 6/2021 | Ochiai | H01L 23/473 |

FOREIGN PATENT DOCUMENTS

| | | |
|---|---|---|
| JP | 2000277669 A | 10/2000 |
| WO | 2019048864 | 3/2019 |

OTHER PUBLICATIONS

JP Search Report issued in App. No. JP2022-528682, dated Jun. 23, 2023, 6 pages.

* cited by examiner

HEAT SINK FOR LIQUID COOLING

TECHNICAL FIELD OF THE DISCLOSURE

The disclosure concerns a module for housing electronic devices and a liquid coolant, comprising a heat sink device.

BACKGROUND TO THE INVENTION

Computers, servers, and other devices used for data processing (referred to as Information Technology or IT) typically comprise printed circuit boards (PCBs). On these PCBs are small devices called Integrated Circuits (IC), which may include central processing units (CPUs), Application Specific Integrated Circuits (ASICs), Graphical Processing Units (GPUs), Random-Access Memory (RAM), etc. All of these electronic components or devices generate heat when in use. In order to maximise the performance of the IT, heat should be transferred away, in order to maintain the contents at an optimal temperature. These considerations also apply to other types of electronic devices or systems.

IT is usually housed within a case, enclosure or housing. In a server for instance, this enclosure is sometimes referred to as the server chassis. A server chassis typically adheres to a number of industry standards that specify the height of each chassis, referred to as 1RU (one rack unit) or 1OU (one open unit), these are also abbreviated to 1U or 1OU. The smaller of the 2 main standards is the 1RU/1U, which is 44.45 mm or 1.75 inches in height. Such units are sometimes referred to as a "blade" server in the sense of shape and style, although it may not be necessary for such a server chassis to slot or plug into a backplane, for example.

Different server products can utilise more than one RU/OU at a time for the chassis, for example a 2U chassis uses 2 rack units. The size of each server chassis is usually kept to a minimum to maximise the amount of computing power per server rack (a server rack is the main housing that server chassis are added to).

Typically, the electronic components or devices that are used on or in IT are cooled using air. This usually includes a heatsink of some kind with fins or similar being placed in contact with the chip surface either directly, or with a TIM (thermal interface material) between the two components. In addition to the heat sink, each enclosure uses a series of fans to pull air through the enclosure, removing heat from the heatsink and expelling it from the chassis. This type of heat sink is used in combination with cooling at the server facility side, such as air conditioning. This method of cooling is not especially efficient, has a high running cost, and uses large amounts of space for managing the air used for cooling.

This method of cooling IT has been used almost exclusively for mass-manufactured IT and server equipment. However, in more recent times, the peak performance of the heat generating chips has been throttled due to the limitations of cooling a device with air. As technology halves in size for the same performance every couple of years (as exemplified in Moore's law), the heat produced by chips is increasing as the footprint of the component decreases. This has seen an increase in the size and complexity of heatsinks designed for air cooling. As a result, there is often an increase in the required server chassis size, thus decreasing the computing power within a single rack.

As an alternative to air cooling, liquid cooling can be used. Liquid cooling can in some cases provide a more efficient heat transfer from the electronic components or devices, and so greater cooling power. These liquids include dielectric fluids, mineral oil and water to mention a few. A number of existing approaches using liquid cooling are known. For example, International Patent Publication No. 2018/096362, commonly assigned with the present disclosure, describes an immersive liquid cooling approach in which a primary liquid coolant, typically a dielectric liquid, is pumped within a sealed chassis, such that the primary liquid coolant stays inside. A heat exchanger is also within the chassis and transfers heat from the primary liquid coolant to a secondary liquid coolant which flows outside the chassis (and may be shared between multiple chassis) and is typically water or water-based (advantageous as having a high specific heat capacity).

Building on this, International Patent Publication No. 2019/048864, also commonly assigned with the present disclosure, describes a number of types of heat sink that may be mounted on, around or adjacent to an electronic device or an electronic device may be mounted on or around the heatsink. The heat sinks define an internal volume for accumulating and retaining primary liquid coolant adjacent to the electronic device (or devices). As the primary liquid coolant flows (by pumping and/or by convection) within the chassis, it is directed to the internal volumes of the heat sinks, causing improved cooling of the electronic devices (for example, ICs getting particularly hot in operation or power supply units). Primary liquid coolant then flows out of the heat sink internal volume (for example, by overflowing and/or by flowing through holes in the volume) and collects with the remaining primary liquid coolant in the chassis, in order to cool other electronic devices (for example, other components or ICs on a PCB or mounted in other ways in the chassis). The primary liquid coolant is again cooled by a heat exchanger in the chassis and heat is transferred to a secondary liquid coolant. In this approach, the level of primary liquid coolant in the chassis can be kept low and certainly lower than the level of primary liquid coolant in the heat sink internal volume. This forms liquid cooling at multiple levels (heights), reducing the quantity of liquid coolant needed and allowing efficient single-phase (that is, liquid-phase only) cooling of the electronic devices. Since the primary liquid coolant can be expensive, difficult to contain and prone to contamination, this approach can provide significant benefits in terms of reduced cost and complexity.

Extending this successful approach to other configurations of component is therefore desirable.

SUMMARY OF THE DISCLOSURE

Against this background, there is provided a module for housing electronic devices and a liquid coolant in accordance with claim 1. Further preferable and/or advantageous features are identified in the dependent claims and in the remaining disclosure herein. A method of manufacturing and/or operating a module for housing electronic devices and a liquid coolant having steps corresponding with the structural features described herein may also be considered.

A heat sink for cooling an electrical or electronic device mounted on the underside of a substrate (such as on the underside of a circuit board) is provided. The heat sink has a receptacle part that is configured to extend around the component being cooled or a thermally conductive part (for example, a conventional heat sink of air-cooled type) that is attached to or mounted on the device being cooled. The heat sink is configured such that, as liquid coolant fills up the receptacle part, it comes into contact with the device and/or the thermally conductive part and cools the device thereby. The liquid coolant flows (by convection and/or pumping)

and as it leaves the receptacle part, it carries away heat from the device. The liquid coolant may overflow the sides of the receptacle part and/or flow out through one or more holes in its sides or base (each hole and all holes taken together typically being relatively small compared with the size of any liquid inlet, such that the receptacle part fills up).

The heat sink is provided within a module with a sealable internal volume (such as a sealable chassis or similar, for example as part of a server blade) for containing electronic devices and the liquid coolant. The liquid coolant is generally a dielectric, so as to be electrically insulating, but thermally conductive. The liquid coolant settles in a base of the sealable internal volume (generally due to gravity) and the level of liquid coolant in the base is typically sufficient to at least partially immerse other electronic devices housed within the sealable internal volume. The level of liquid coolant in the receptacle part is advantageously higher than the level of liquid coolant in the base. This approach may have significant benefits where the substrate is raised from the base relative to another substrate, on which the other electronic devices are mounted (for example, a motherboard). The heat sink can therefore provide multiple levels of liquid coolant even for devices that are mounted on the underside of a circuit board.

The thermally conductive part generally takes the form of a conventional heat sink, for example having a planar part mounted on the electronic device. Projections (pins and/or fins) may extend from the thermally conductive part (particularly, its planar part) into the internal volume of the receptacle part. These projections (which are preferably integral with the thermally conductive part) may extend the whole way to a distal surface of receptacle part. The receptacle part is beneficially wider (in the sense of any non-height dimension) than device being cooled and/or the thermally conductively part, such that a gap is provided for the flow of liquid coolant.

Liquid coolant may be received within the receptacle part through one or more liquid inlets, for example each liquid inlet comprising an aperture or hole in the receptacle part, which may be in the bottom (proximate the base or distal the device being cooled) or a side of the receptacle part. In embodiments, the liquid inlet may be positioned around or offset from the centre of the bottom surface of the receptacle part (that is, the surface closest to the base). The position of the liquid inlet may be opposite a hottest part of the device being cooled in operation. The liquid coolant may be provided to the receptacle part through a pipe and/or nozzle, for example from a pump or the base.

The receptacle part may be fixed to the substrate, the device being cooled and/or the thermally conductive part. For instance, this may be achieved by screws, bolts or similar fixing means. Additionally or alternatively, the receptacle part may be clipped, for instance using resiliently biased arms having suitable grips thereupon.

A heat exchanger may transfer heat from the liquid coolant to a secondary (liquid) coolant (which may advantageously be water-based) and is typically received from external the module, carrying the transferred heat away from the module.

BRIEF DESCRIPTION OF THE DRAWINGS

The disclosure may be put into practice in a number of ways and preferred embodiments will now be described by way of example only and with reference to the accompanying drawings, in which.

DETAILED DESCRIPTION OF PREFERRED EMBODIMENTS

The present disclosure extends the type of heat sink device described in International Patent Publication No. 2019/048864 to the cooling of electrical or electronic devices mounted on the underside of substrates, such as circuit boards or PCBs. As previously, the electronic devices may form a computer server, for instance comprising a motherboard, Integrated Circuits (ICs) and other associated components. The underside of the substrate may refer to any surface where, under the normal operational orientation of the chassis (which is preferably a blade server, for example as discussed above), liquid coolant directed to the device will not collect around the device due to gravity. Whereas the heat sink devices previously described direct coolant into the top of a volume on, adjacent or around the device to be cooled, this is not straightforward when a surface is positioned on top of the device. Rather, a level of coolant in the base of the chassis, provided for immersion cooling of other electronic devices (typically of a lower operational temperature than those being cooled using a heat sink device) may also be used to cool electronic devices on the underside of substrates. However, this approach requires a higher level of coolant in the base than would otherwise be needed. As noted above, reducing the amount of liquid coolant in the chassis is beneficial for reasons of cost, weight, complexity, robustness and the server chassis is easier to hold and/or carry.

Like the heat sink devices previously described, a volume for liquid coolant (which may be termed a "bath") that can cool heat-generating components on the underside of a substrate, in particular a substrate more distal from the base than a main substrate (circuit board, for example a motherboard) can provide significant improvement in cooling that device. It may especially mean that the level of liquid coolant does not need to rise significantly, to accommodate just one component.

Figure 1:
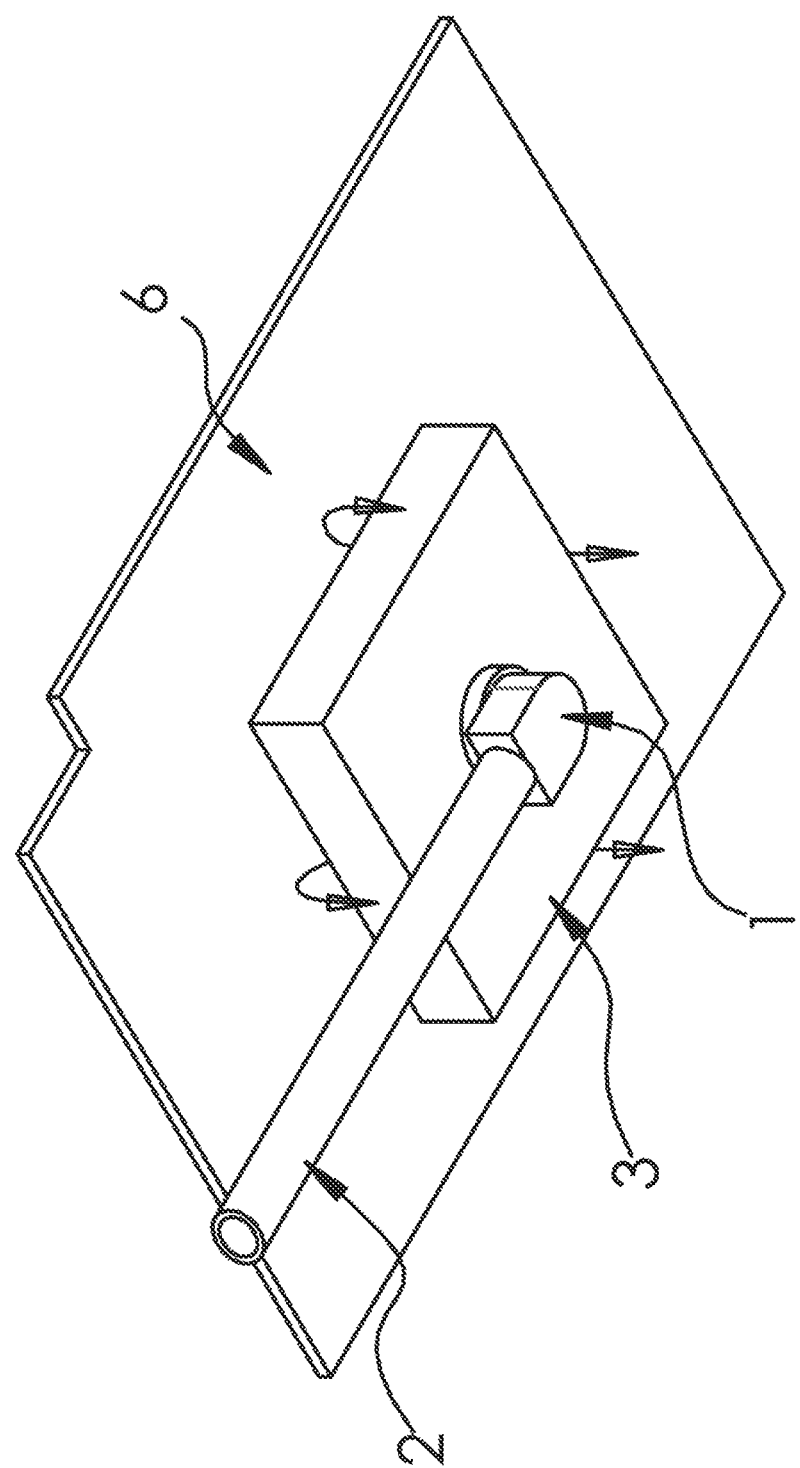
FIG. 1 shows an isometric schematic view of an embodiment according to the disclosure.
Figure 2:
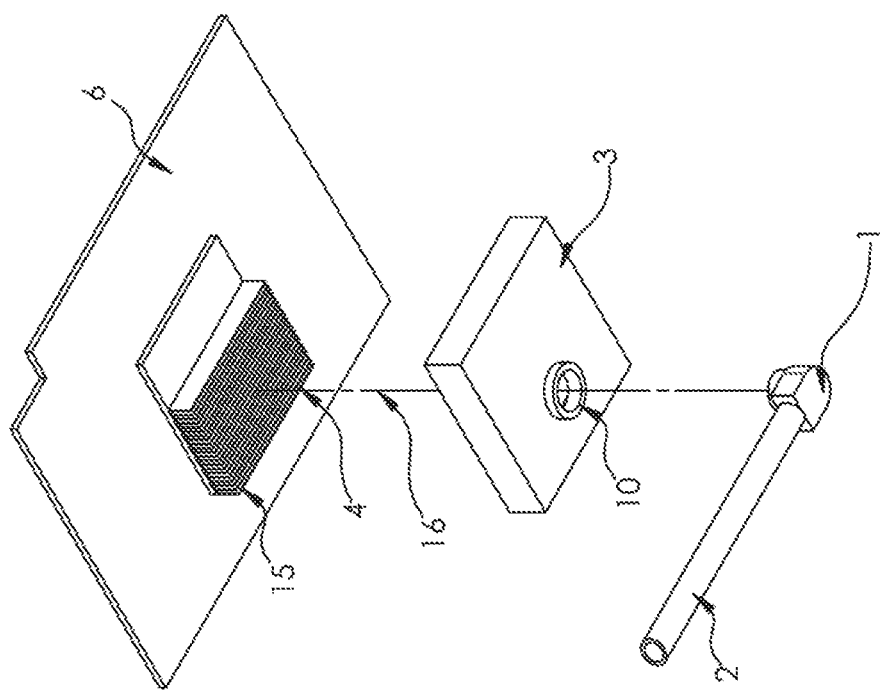
FIG. 2 depicts an exploded isometric view of the design shown in FIG. 1.

Referring first to FIG. 1, there is shown an isometric schematic view of an embodiment, especially showing: substrate 6 (which is typically a circuit board, PCB, motherboard or daughter-board); heat sink receptacle part 3; nozzle 1; and hose (or pipe) 2. For further details, reference is made to FIG. 2, in which there is depicted an exploded isometric view of the design shown in FIG. 1. Where the same features are shown, identical reference numerals are employed. There is additionally shown: thermally conductive part 4; and receptacle liquid inlet 10. The thermally conductive part 4 is in the form of an air-cooled heatsink, of the type that would conventionally be provided on a high heat-generating electronic device, for example an Integrated Circuit (IC), of which a processor would be one type. In this respect, projections 15, in the forms of fins, are provided on the thermally conductive part 4.

The liquid coolant is delivered from the nozzle 1 on the end of the hose 2 into the receptacle part 3. This takes the form of a "bath" or a liquid-holding volume and is attached onto the thermally conductive part 4 or substrate 6, as will be further described below. The liquid inlet 10 is shown as offset from the centre of a bottom (or underside) of the thermally conductive part 4 (which has the planar dimensions that are the same as or more typically bigger than the electronic device being cooled, not shown) and this is indicated by axis 16.

Advantageously, the use of a "bath" heat sink, in the form of the receptacle part 3, which fits around existing air-cooled heatsinks (thermally conductive part 4) means that the technology is straightforward to retrofit and add on to current IT hardware.

In a generalised sense, there may be considered a heat sink device, comprising a receptacle part defining an internal volume that is arranged to receive liquid coolant and accumulate the liquid coolant therein. The heat sink is mounted such that an electronic device (specifically one of the electronic devices that is housed in a module) or a component that is thermally conductively coupled to the electronic device is at least partially within the internal volume. In this way, liquid coolant that accumulates within the internal volume is caused to come into direct contact within the electronic device and/or the component that is thermally conductively coupled to it, for heat transfer to the liquid coolant. For instance, the receptacle part may be substantially closed on all sides except one (its top side) and the electronic device and/or the component that is thermally conductively coupled to it extends into the internal volume through the open (non-closed) side.

The component that is thermally conductively coupled part may comprise (or be termed) a conduction part or a thermally conductive part (as discussed above). Advantageously, the conduction part is mounted on the electronic device being cooled so as to receive heat from the electronic device by conduction. The conduction part is preferably at least partially within the internal volume of the heat sink device.

The conduction part may have the form and/or material of an existing air-cooled type heat sink. For example, the conduction part may comprise projections extending into the internal volume of the heat sink device. The projections may take the form of pins and/or fins. The projections may extend from a relatively planar part of the conductions surface, for instance that is mounted on (and/or affixed to) the electronic device being cooled.

The receptacle part preferably comprises a liquid inlet for receiving the liquid coolant into the internal volume. Advantageously, the liquid inlet is located on a portion of the receptacle part distal the electronic device (or an open end of the receptacle part). In embodiments, the liquid inlet is located in a central portion of the surface area of the receptacle part. For instance, the liquid inlet may be located in a surface of the receptacle part opposite the electronic device (that is, opposite its open side).

Preferably, a nozzle arrangement (which is optionally separate or separable from the liquid inlet and/or couplable or coupled to the liquid inlet) is arranged to direct the liquid coolant into the liquid inlet. Additionally or alternatively, a pipe or hose may be provided (which may be coupled to the nozzle arrangement), arranged to direct the liquid coolant to the liquid inlet.

Further details of specific implementations will now be discussed. However, reference will again be made to this generalised sense below.

Figure 3:
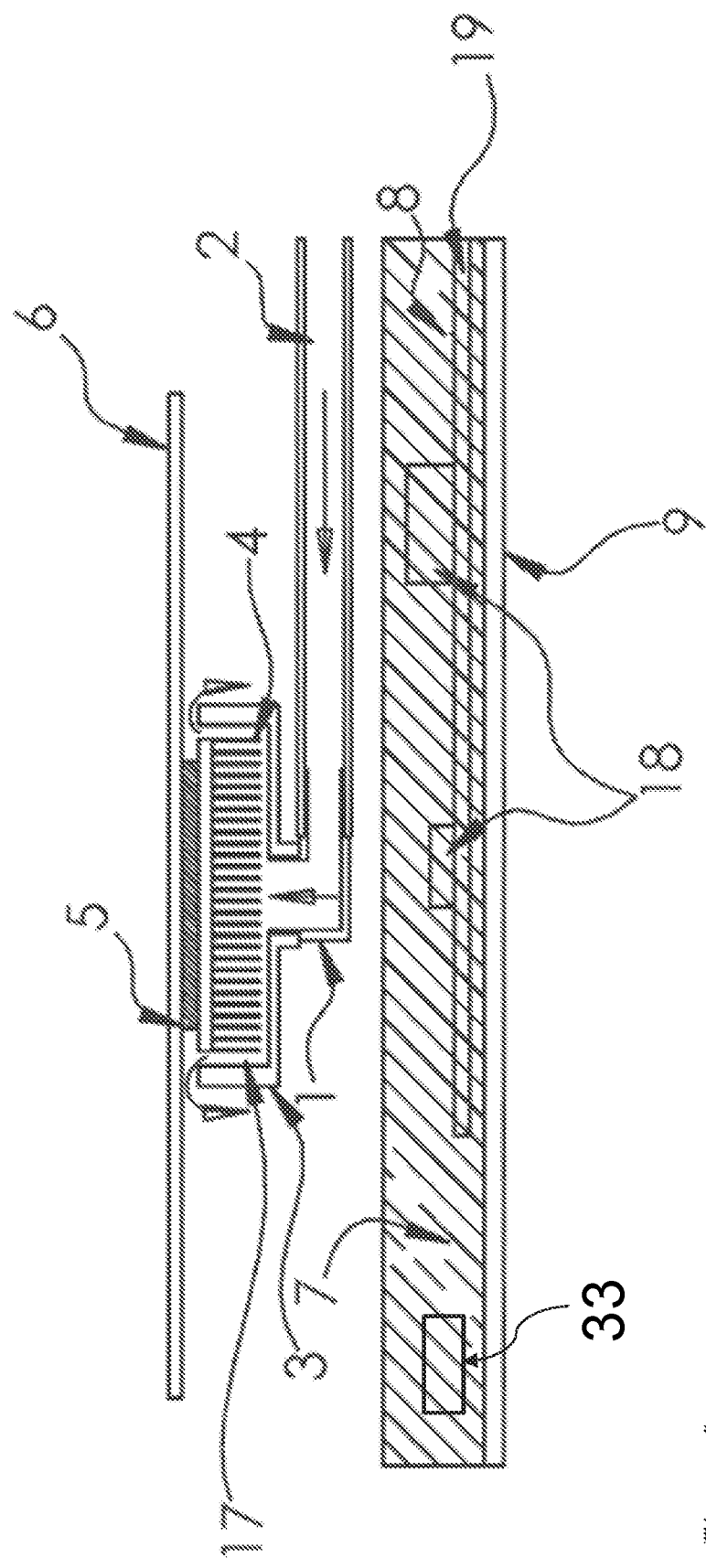
FIG. 3 schematically illustrates a cross-sectional view of an embodiment according to the disclosure, including the design shown in FIG. 1.

Referring now to FIG. 3, there is schematically illustrated a cross-sectional view of an embodiment, including the design discussed above. The same features as shown in previous drawings are labelled with identical reference numerals. In this drawing, there is further shown: electronic device being cooled 5 (for example, an IC or processor) mounted on the substrate 6; server chassis base 9; main PCB or motherboard 19; other electronic devices to be cooled 18; dielectric coolant 7 that is away from the other electronic devices 18; and dielectric coolant 8 that is closer to the other electronic devices 18.

The liquid coolant passing through hose 2 and nozzle 1 accumulates in the receptacle part 3. The thermally conductive part 4 is thereby essentially immersed in the liquid coolant and heat is transferred from the hot electronic device 5, through the thermally conductive part 4 and to the liquid coolant in the receptacle part 3. As shown, the receptacle part 3 has a gap 17 around the thermally conductive part 4, to allow liquid coolant to be able to circulate around and contact the entire surface area of the thermally conductive part 4. This gap is due to the receptacle part being wider (that is, in the dimensions of the plane parallel to the PCB 6) than the extent of the thermally conductive part 4. In this design, the gap 17 also extends below the thermally conductive part 4. That is the projections 15 do not extend to the surface of the receptacle part 3 that is opposite them.

Coolant overflows the receptacle part 3 and collects in the chassis base 9. The level of dielectric coolant 7, 8 in the chassis base 9 is shown. As can be seen, this level is below the level of liquid coolant in the receptacle part 3 (or even below the bottom of the receptacle part 3). Nonetheless, the level of dielectric coolant 7, 8 in the chassis base 9 is sufficient to immerse the other electronic (or electrical) devices to be cooled 18 on PCB 19.

The hot component 5 on the underside of the PCB 6 and/or its air-cooled heatsink are above the nominal coolant level 7, 8. Nevertheless, one or both of these is at least partially immersed in this way. The receptacle part 3 (the "bath") then fills from the base upwards, cooling and spreading to all the projections 15 of the thermally conductive part 4, before the coolant reaches the top of the receptacle part 3 and overspills, cooling other existing components 18 on the main PCB (or motherboard) 19. The heat from the hot component 5 is thereby transferred into the dielectric coolant 7, 8 within the server chassis. A heat exchanger 33 receives a secondary (water-based) coolant from outside the server chassis and transfers heat from the liquid coolant 7, 8 to the secondary liquid coolant, which takes the heat away from the server chassis. The flow of the liquid coolant is typically effected by a pump (also not shown).

Returning to the generalised sense discussed above, a further aspect may consider a module for housing electronic devices and a liquid coolant. The module preferably comprises: a housing defining a sealable internal volume for containing electronic devices and the liquid coolant. The sealable internal volume has a base (which may for example, be planar, especially when the sealable internal volume generally takes an elongated or rectangular cuboid shape) and the base may also be termed a bottom surface. The liquid coolant may generally settle in the base during normal operation (due to gravity). The module advantageously further comprises a substrate in the sealable internal volume, approximately parallel to the base. The electronic device being cooled is mounted on a side of the substrate proximal the base (that is its underside). The electronic device and/or the component that is thermally conductively coupled to it is beneficially positioned in the internal volume of the heat sink as described above (and further herein).

In embodiments, the receptacle part is wider than a width of the one of the electronic devices and/or component that is thermally conductively coupled to the one of the electronic devices. The term "width" in this context may mean a dimension that is generally parallel to or in the plane of the substrate and/or base (and thus could also refer to a length or radius, for example). A gap is preferably provided between the receptacle part of the electronic devices and/or component that is thermally conductively coupled to the one of the electronic devices, when the heat sink device is in place.

The liquid coolant is arranged to flow in operation, in particular such that the liquid coolant in the base is directed towards the receptacle part. This may be achieved by convection of the liquid coolant during normal operation of the electronic devices in the module. Additionally or alternatively, the module may further comprise a pump, configured to cause the liquid coolant to flow. For instance, the pump may receive the liquid coolant from the base (due to suitable piping).

Advantageously, the heat sink device is configured (for instance, by being mounted) such that the liquid coolant flows out the receptacle part. The liquid coolant advantageously overflows the receptacle part. Additionally or alternatively, the liquid coolant may flow through a hole in the receptacle part. The liquid coolant flowing out of the receptacle part is beneficially directed to the base of the sealable internal volume. It may collect with other liquid coolant there, for cooling one or more other electronic devices housed in the module. Such one or more other electronic device are typically mounted closer to the base than the electronic devices mounted on a side of the substrate proximal the base (that is, on its underside). These one or more other electronic devices (which are generally other components of the same overall device as the electronic device cooled by the heat sink) are thereby at least partially immersed by a level of liquid coolant in the base. A level of liquid coolant in the receptacle part is higher than the level of liquid coolant in the base (and may be significantly higher, for example, at least 10%, 20%, 25%, 30%, 40% or 50% higher).

The module may further comprise a heat exchanger, arranged in the module to receive the liquid coolant and to transfer heat from the liquid coolant to a secondary coolant. The secondary coolant is preferably a liquid (for instance, water-based). It is generally isolated from the liquid coolant in the sealable internal volume. The secondary coolant is advantageously received from external the module, with the heated secondary coolant being transferred away from the module.

Other details of specific implementations will be discussed below. Further reference to generalised senses of the disclosure will again be considered subsequently.

Figure 4:
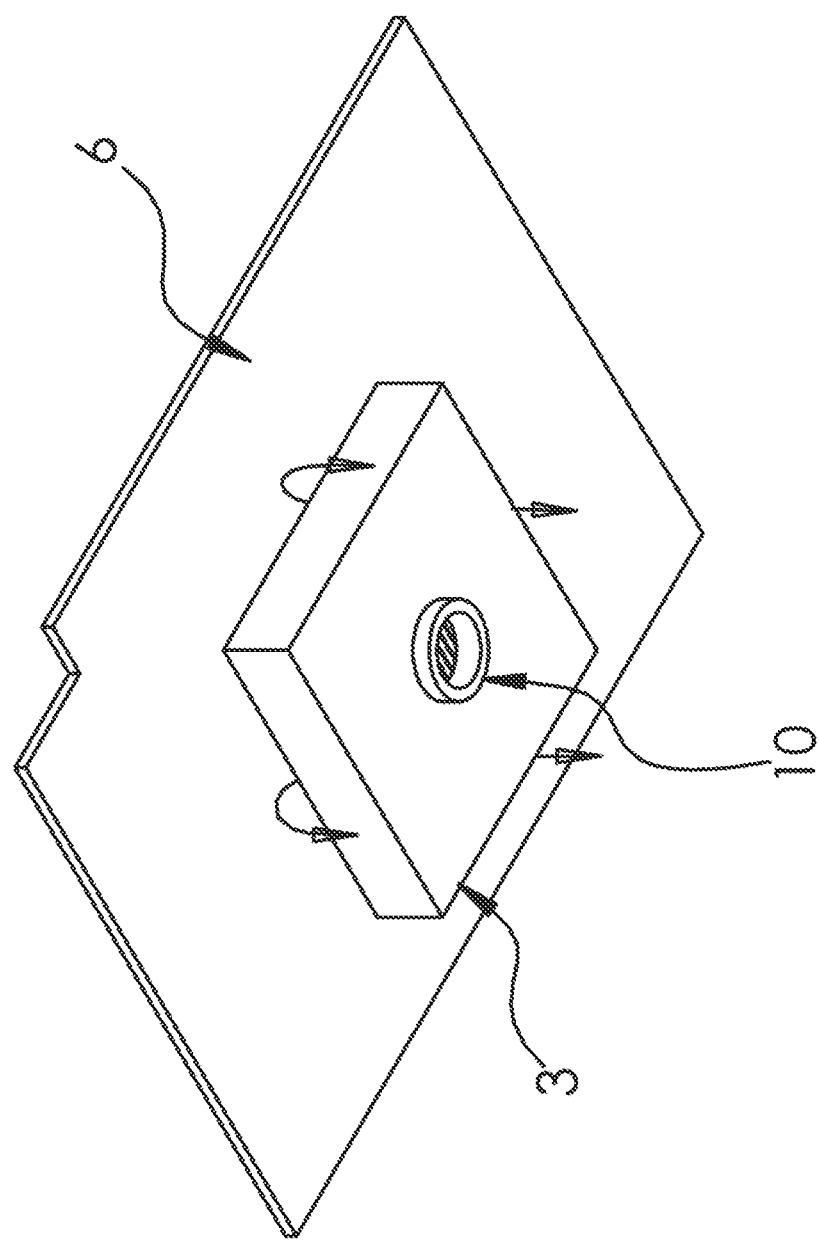
FIG. 4 shows an isometric schematic view of a part of a variation of the design shown in FIG. 1.

Next, reference is made to FIG. 4, in which there is shown an isometric schematic view of a part of a variation of the design discussed above. Identical reference numerals as used above are employed to label the same features. Here, the liquid inlet 10 is placed more in the centre of the bottom of the receptacle part 3. The projections 15 on the thermally conductive part 4 may be symmetric or asymmetric and the placing of the liquid inlet 10 may match these, for example to allow targeted cooling to the specific electronic device being cooled.

Figure 5:
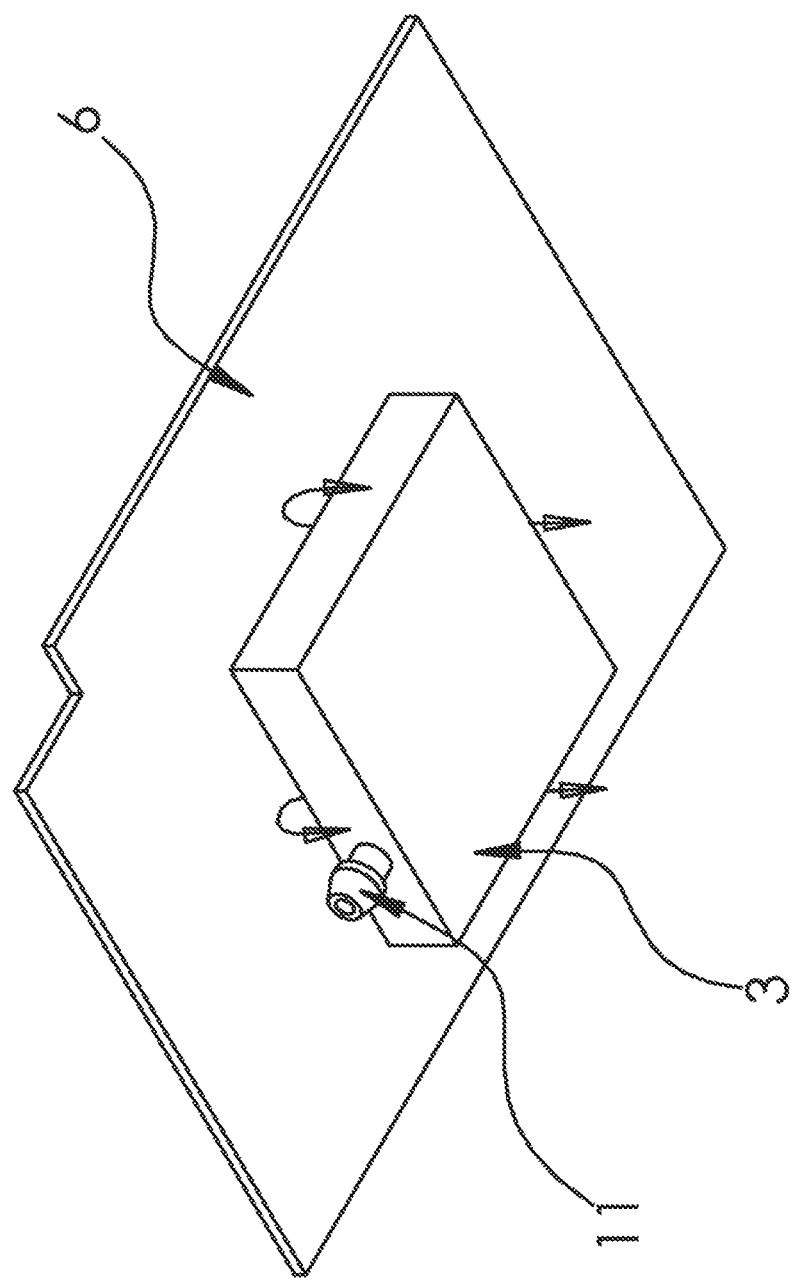
FIG. 5 depicts an isometric schematic view of a variant on the design shown in FIG. 1.
Figure 6:
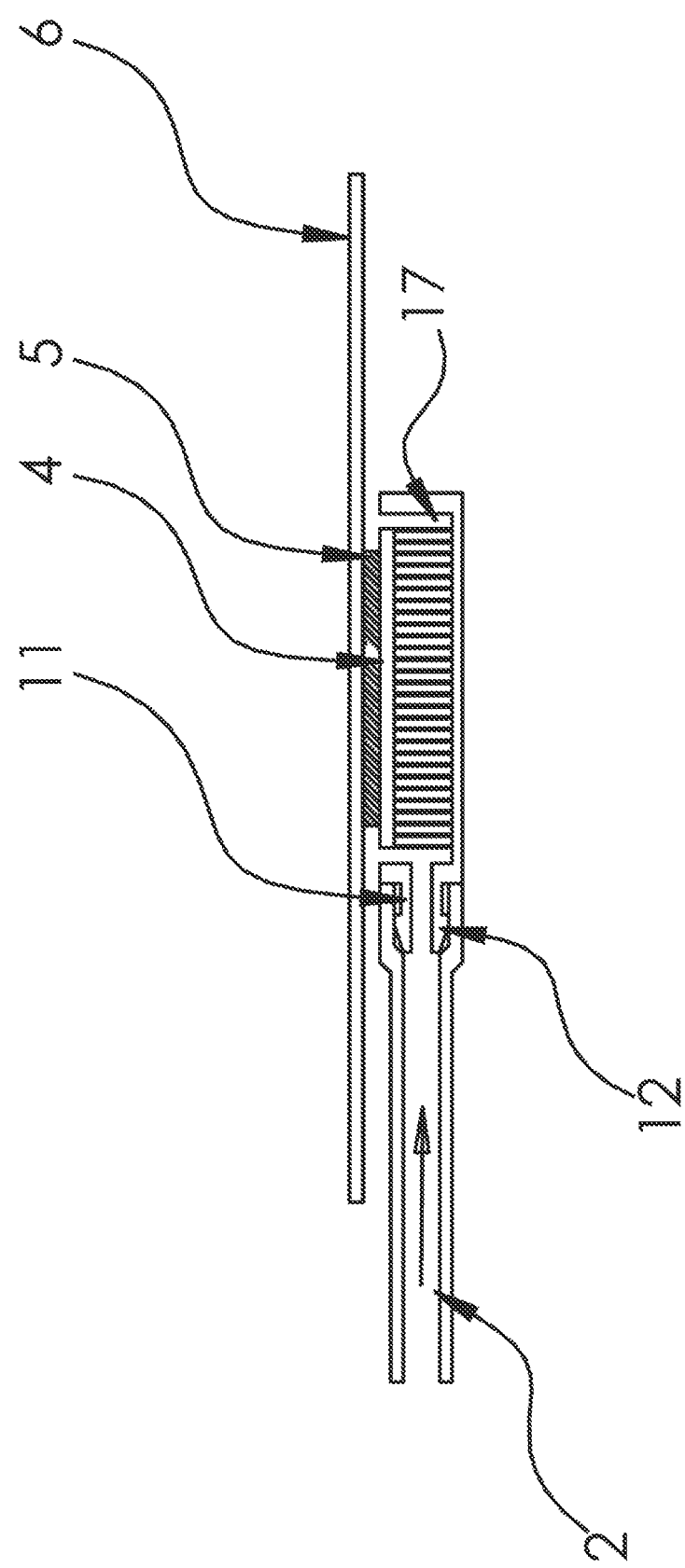
FIG. 6 schematically illustrates a cross-sectional view of the design shown in FIG. 5.

Referring now to FIG. 5, there is depicted an isometric schematic view of a variant on the design shown in FIG. 1. In this respect, reference is also made to FIG. 6, in which there is schematically illustrated a cross-sectional view of the same design. Again, features shown in other drawings are labelled with identical reference numerals. Although the liquid inlet 10 above is provided on the bottom of the receptacle part 3, another approach is to provide a liquid inlet 11 on the side of the receptacle part 3, as shown in these drawings. The liquid inlet 11 can be integral with the receptacle part. A coupling 12 is provided between the liquid inlet 11 and the hose 2. A nozzle is therefore not required. In this design, the projections 15 may extend to the surface of the receptacle part 3 that is opposite them. This is because the liquid inlet 11 is not provided on this surface, but rather on the side surface.

In the generalised terms considered above, embodiments will be conceived in which the liquid inlet is located on a side of the receptacle part (although is typically at the bottom of the side, in which the term bottom may mean distal the electronic device being cooled and/or the open side of the receptacle part). In this way, the liquid coolant may still fill the receptacle part. A nozzle may not be required in such an arrangement. The liquid inlet and at least a portion of the pipe may be integrally formed.

Preferably additionally (but optionally alternatively), the projections of the conduction part may extend from the conduction part to a surface of internal volume of the heat sink device that is distal the one of the electronic devices (and/or the conduction part). This may be beneficial where the liquid inlet is located on a side of the receptacle part, since the projections configured as such may not interfere with the flow of liquid coolant into the internal volume of the receptacle part.

Advantageously, the heat sink device further comprises a fixing for mounting the receptacle part of the heat sink device to one or more of: the substrate; the one of the electronic devices; and the component that is thermally conductively coupled to the one of the electronic devices. Examples of suitable fixings will be discussed below. Multiple fixings may be provided.

Figure 7:
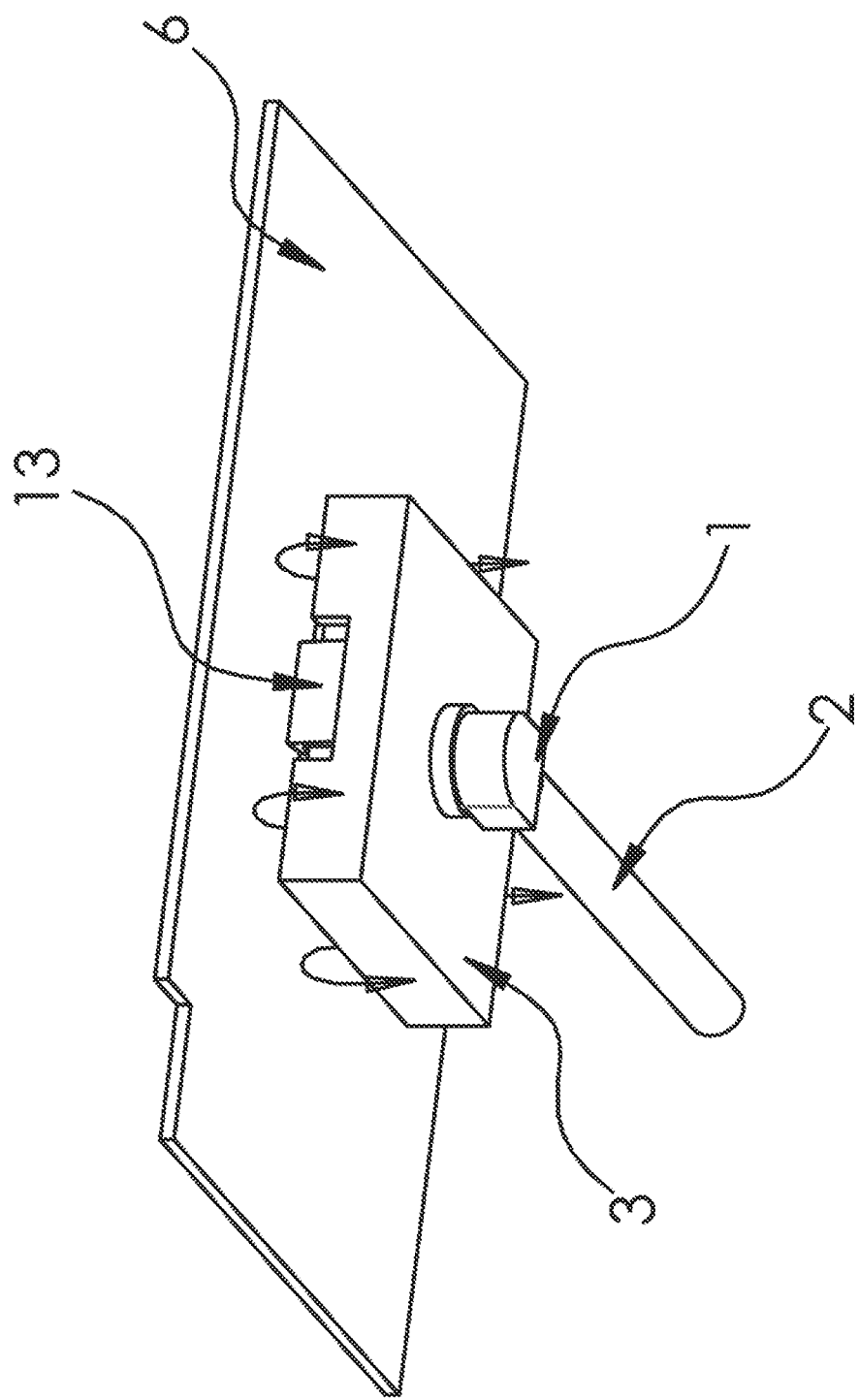
FIG. 7 shows an isometric schematic view of the design shown in FIG. 1 with additional details according to a first implementation.
Figure 8:
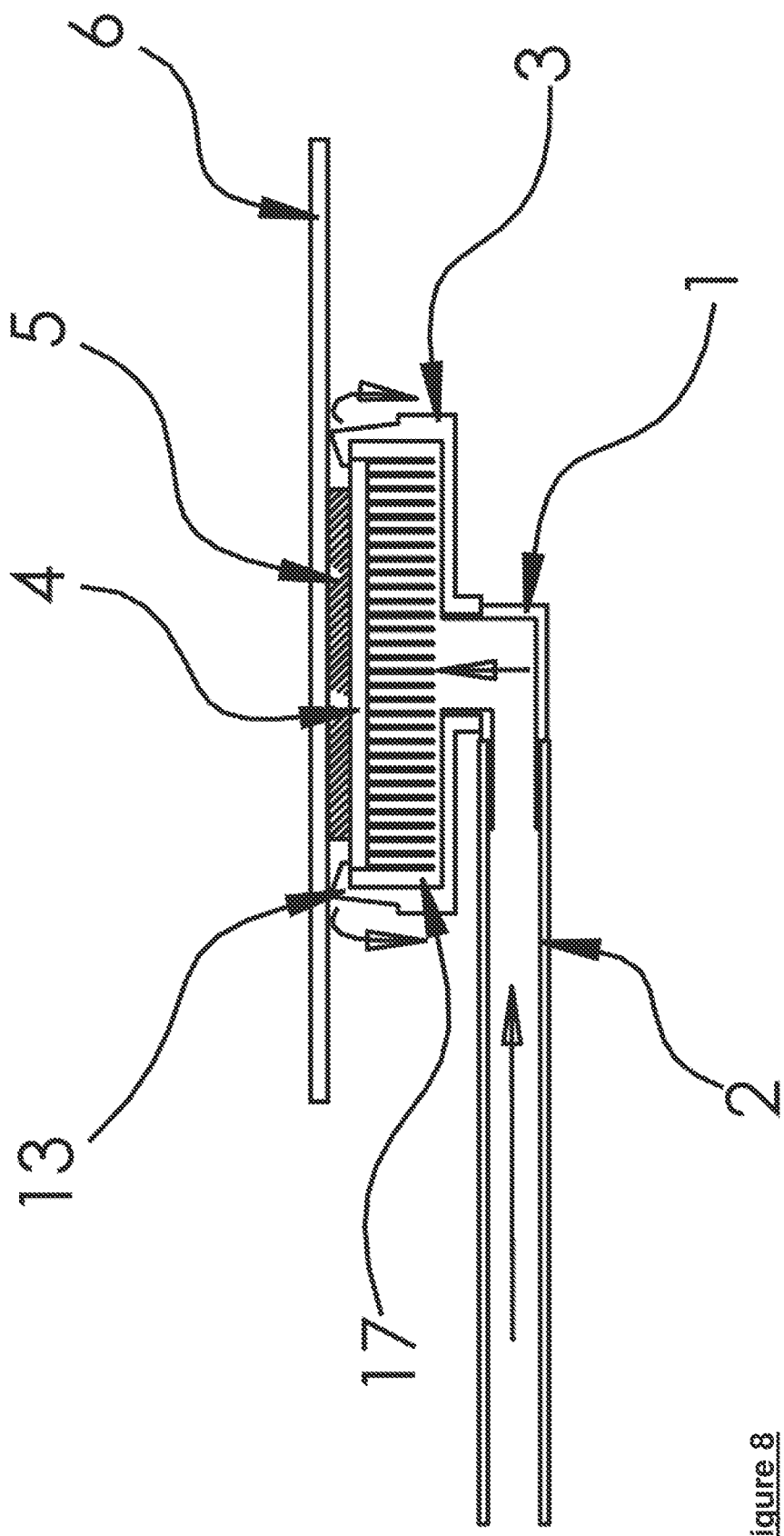
FIG. 8 schematically illustrates a cross-sectional view of the design shown in FIG. 7.

In this respect and returning to specific implementations, reference is next made to FIG. 7, in which there is shown an isometric schematic view of the design discussed above, with additional details regarding a first approach to fixing the receptacle part 3. Reference is also made to FIG. 8, in which there is schematically illustrated a cross-sectional view of the design shown in FIG. 7. Features shown in previous drawings are labelled with identical reference numerals. Additionally shown in these drawings are clips 13 for attaching the receptacle part 3 to the thermally conductive part 4. Despite the use of these clips, gaps 17 still allow flow of liquid coolant within the receptacle part 3 and for the liquid coolant to overflow the receptacle part 3. The clips 13 take advantage of a gap between the thermally conductive part 4 and the PCB 6 that is the height of the electronic device 5. The thermally conductive part 4 (in the form of an air-cooled type heat sink) is generally larger than the electronic device 5 to which is mounted, so this takes advantage of that overlap.

Figure 9:
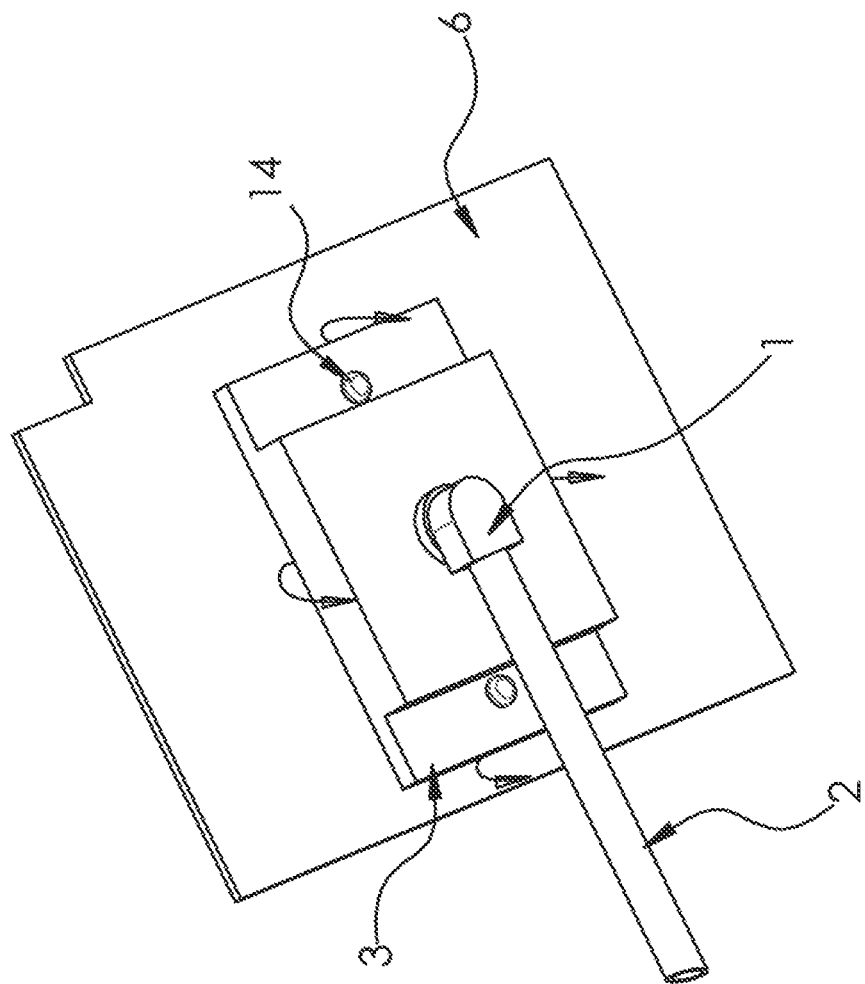
FIG. 9 shows an isometric schematic view of the design shown in FIG. 1 with additional details according to a second implementation.
Figure 10:
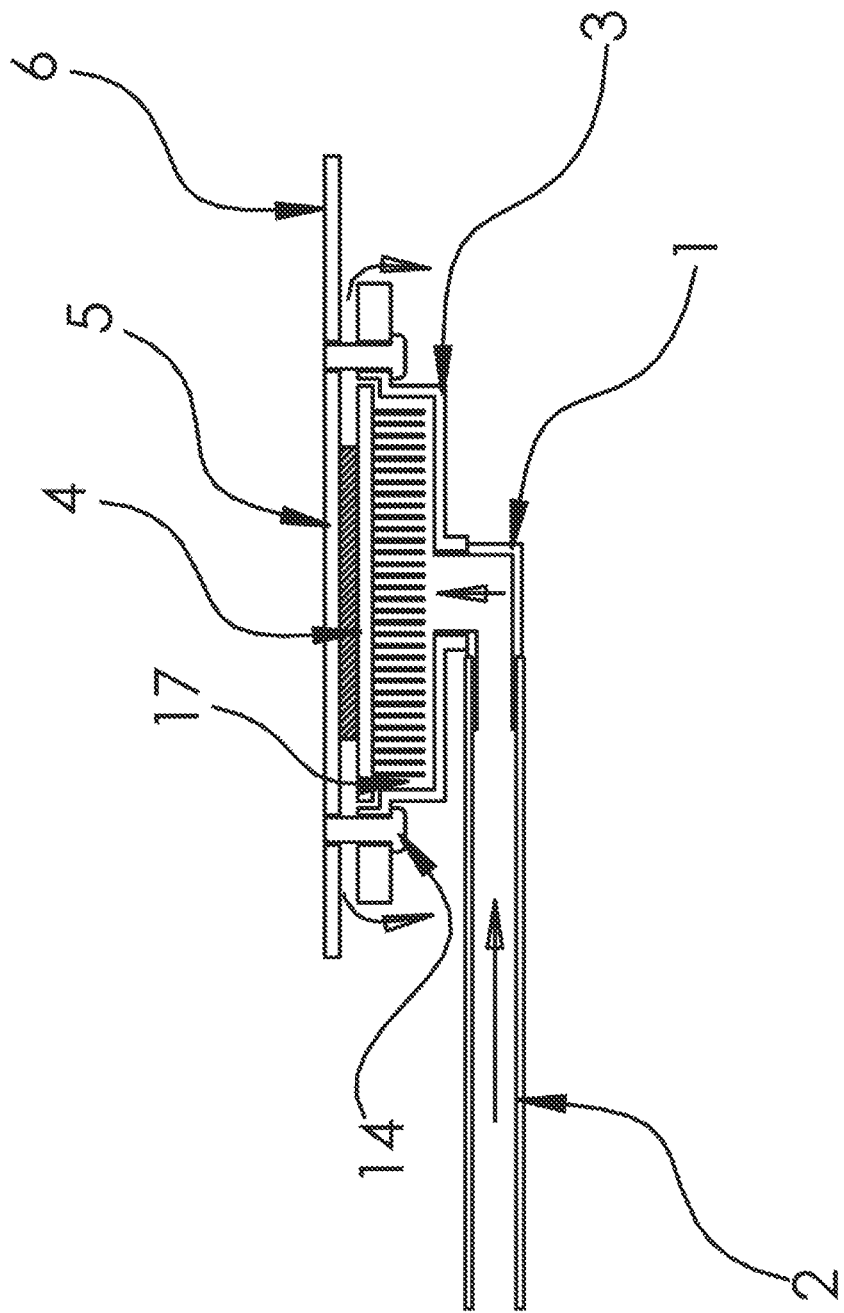
FIG. 10 schematically illustrates a cross-sectional view of the design shown in FIG. 9.

Now referring to FIG. 9, there is shown an isometric schematic view of the design described above, with additional details regarding a second approach to fixing the receptacle part 3. In this respect, reference is also made to FIG. 10, in which there is schematically illustrated a cross-sectional view of the design shown in FIG. 9. As before, the same features of previous drawings are labelled with identical reference numerals. Here the receptacle part 3 is attached to the PCB 6 using fixing points 14 on the PCB 6, which would normally be provided for other types of heat sink.

In the generalised sense discussed above, the fixing may comprise a clip, arranged to hold the receptacle part of the heat sink device on the substrate or the component that is thermally conductively coupled to the one of the electronic devices. The fixing may comprise a screw, bolt, rivet or similar attachment device.

Although specific embodiments have now been described, the skilled person will appreciate that various modifications and alternations are possible. The configuration of the electronic device cooled by the heat sink and/or other electronic devices may vary significantly. The exact shape and/or size of the heat sink device may also be modified. The structure of the heat sink device may also change, for example using other multi-part assemblies or as an integrally constructed device.

The liquid inlet may be placed in different orientations and indeed, multiple liquid inlets may be provided in some embodiments. This allows different nozzle entry points and/or placement. Where projections are shown, any combination of pins, fins or other projections may be used. Whilst a specific multi-part cold plate assembly is described, it is appreciated that the cold plate heat sink hybrid device may be implemented.

Although the main flow of liquid coolant out of the receptacle part is described by overflowing, additionally or alternatively, holes may be provided in the receptacle part to allow liquid coolant to flow out to the remainder of the chassis (sealable) internal volume.

All of the features disclosed herein may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

The invention claimed is:

1. A module for housing electronic devices and a liquid coolant, the module comprising:
a housing defining a sealable chassis for containing the electronic devices and the liquid coolant, the sealable chassis having a base;
a substrate in the sealable chassis approximately parallel to the base, one of the electronic devices being mounted on an underside of the substrate proximal the base; and
a heat sink device, comprising a receptacle part defining an internal volume that is arranged to receive the liquid coolant and accumulate the liquid coolant therein so that the liquid coolant in the receptacle part is higher than a level of liquid coolant in the base, the heat sink device being mounted such that the one of the electronic devices or a component that is thermally conductively coupled to the one of the electronic devices is at least partially within the internal volume so as to be in contact with the liquid coolant.

2. The module of claim 1, wherein the heat sink device further comprises a conduction part, mounted on the one of the electronic devices so as to receive heat from the one of the electronic devices by conduction and wherein the conduction part is at least partially within the internal volume of the heat sink device.

3. The module of claim 2, wherein the conduction part comprises projections extending into the internal volume of the heat sink device.

4. The module of claim 3, wherein the projections extend from the conduction part to a surface of the internal volume of the heat sink device that is distal the one of the electronic devices.

5. The module of claim 1, wherein the receptacle part is wider than a width of the one of the electronic devices and/or component that is thermally conductively coupled to the one of the electronic devices.

6. The module of claim 1, wherein the receptacle part comprises a liquid inlet for receiving the liquid coolant into the internal volume of the heat sink device and wherein the liquid inlet is located on a portion of the receptacle part distal the one of the electronic devices.

7. The module of claim 6, wherein the liquid inlet is located in a central portion of a surface area of the receptacle part.

8. The module of claim 6, wherein the liquid inlet is located on a side of the receptacle part.

9. The module of claim 1, wherein the receptacle part comprises a liquid inlet for receiving the liquid coolant into the internal volume of the heat sink device, the module further comprising one or both of:
a nozzle arrangement, arranged to direct the liquid coolant into the liquid inlet; and
a pipe, arranged to direct the liquid coolant to the liquid inlet.

10. The module of claim 1, arranged for the liquid coolant to flow in operation, such that the liquid coolant in the base is directed towards the receptacle part.

11. The module of claim 1, further comprising:
a pump, configured to cause the liquid coolant to flow.

12. The module of claim 1, wherein the heat sink device further comprises a fixing for mounting the receptacle part of the heat sink device to one or more of: the substrate; the one of the electronic devices; and the component that is thermally conductively coupled to the one of the electronic devices.

13. The module of claim 12, wherein the fixing comprises a clip, arranged to hold the receptacle part of the heat sink device on the substrate or the component that is thermally conductively coupled to the one of the electronic devices.

14. The module of claim 1, wherein the heat sink device is configured such that the liquid coolant flows out the receptacle part and is directed to the base of the sealable chassis.

15. The module of claim 1, wherein at least one further electronic device is mounted closer to the base than the one of the electronic devices mounted on a side of the substrate proximal the base, the at least one further electronic device being at least partially immersed by the level of liquid coolant in the base.

16. The module of claim 1, further comprising:
a heat exchanger, arranged in the module to receive the liquid coolant and to transfer heat from the liquid coolant to a secondary coolant.

* * * * *